(12) United States Patent
Jeng

(10) Patent No.: US 6,939,768 B2
(45) Date of Patent: Sep. 6, 2005

(54) METHOD OF FORMING SELF-ALIGNED CONTACTS

(75) Inventor: Pei-Ren Jeng, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 106 days.

(21) Appl. No.: 10/403,060

(22) Filed: Apr. 1, 2003

(65) Prior Publication Data

US 2004/0198006 A1 Oct. 7, 2004

(51) Int. Cl.⁷ .................... H01L 21/336; H01L 21/338; H01L 21/8238; H01L 21/331
(52) U.S. Cl. ............... 438/299; 438/180; 438/229; 438/364
(58) Field of Search ................ 438/180, 229, 438/299, 399, 364

(56) References Cited

U.S. PATENT DOCUMENTS 4,029,522 A * 6/1977 De La Moneda ........... 438/179
6,043,116 A * 3/2000 Kuo ........................... 438/233
6,667,230 B2 * 12/2003 Chen et al. .................. 438/613

* cited by examiner

Primary Examiner—David Nelms
Assistant Examiner—Chuong Anh Luu
(74) Attorney, Agent, or Firm—Akin Gump Strauss Hauer & Feld, LLP

(57) ABSTRACT

A method of forming self-aligned contacts that includes providing at least one stacked-gate structure on a semiconductor substrate, forming a first dielectric layer on the stacked-gate structure and the semiconductor substrate, forming a second dielectric layer on the first dielectric layer, the second dielectric layer being etch selective relative to the first dielectric layer, etching the second dielectric layer to expose a portion of the first dielectric layer formed on a top surface and along at least a portion of upper sidewalls of the stacked-gate structure, removing the exposed portion of the first dielectric layer, and forming a third dielectric layer on the sidewalls of the stacked-gate structure.

20 Claims, 4 Drawing Sheets

METHOD OF FORMING SELF-ALIGNED CONTACTS

TECHNICAL FIELD

This invention pertains in general to a semiconductor integrated circuit and, more particularly, to a method of forming a self-aligned contact in a semiconductor integrated circuit.

BACKGROUND

A field-effect transistor ("FET") generally includes an insulating layer formed on a semiconductor substrate, a polycrystalline silicon gate formed on the insulating layer, a pair of source/drain regions formed in the semiconductor substrate, and a channel region formed below the gate insulating layer and separated by the source/drain regions. In the fabrication of FETs, typical complementary metal-oxide-semiconductor ("CMOS") techniques include a metallization process to electrically couple source/drain pairs to circuits. The metallization process may include providing a patterned mask layer over the semiconductor substrate to expose a source or drain region formed in the semiconductor substrate. Specifically, an opening is made through the patterned mask layer using conventional lithographic techniques for a later deposition of metal materials such as aluminum or aluminum alloys in the opening. In deep sub-micron CMOS processes, however, due to a higher device density on a semiconductor substrate and a smaller device, integrated circuit devices have been miniaturized. As a result, openings for forming metal contacts have smaller dimensions and become liable to mask misalignment. To alleviate limitations set by mask alignment tolerances, self-aligned contact ("SAC") techniques are generally used to allow for a less precise alignment of masks.

FIG. 1 shows a cross-sectional view of a conventional FET device 10. Referring to FIG. 1, FET device 10 formed on a semiconductor substrate 12 includes a stacked-gate structure 14, a gate insulating layer 16 formed on semiconductor substrate 12 and disposed under stacked-gate structure 14, a source/drain pair 18 formed in semiconductor substrate 12 and separated apart from each other by a channel region 20, and sidewall spacers 22 surrounding the sidewalls (not numbered) of stacked-gate structure 14. Stacked-gate structure 14 may include a conductively doped polycrystalline silicon gate 24, a refractory metal gate 28, and an interlayer dielectric ("ILD") 26 to isolate gates 24 and 28. FET device 10 usually also includes a conformal layer 30 of silicon oxide formed over gate insulating layer 16 and stacked-gate structure 14 to serve as a stress buffer layer.

A self-aligned contact (not shown) is then formed after source/drain pair 18 is ion implanted. Conventional methods of forming a self-aligned contact may include providing a dielectric layer 32, for example, an oxide layer, over semiconductor substrate 12, and etching dielectric layer 32, buffer layer 30 and gate insulating layer 16 to expose a source/drain region 18, thereby forming a contact opening 34 for a later deposition of contact metal (not shown). Since dielectric layer 32 and buffer layer 30 are composed of silicon oxide, an etchant used to reduce dielectric layer 32 would also attack buffer layer 30 formed between stacked-gate structure 14 and sidewall spacers 22, resulting in an exposure of metal layer 28 as circled, and causing a short-circuit between exposed metal layer 28 and the contact metal to be filled in contact opening 34.

SUMMARY OF THE INVENTION

Accordingly, the present invention is directed to a method that obviates one or more of the problems due to limitations and disadvantages of the related art.

Additional features and advantages of the present invention will be set forth in the description which follows, and in part will be apparent from the description, or may be learned by practice of the invention. The objectives and other advantages of the invention will be realized and attained by the methods particularly pointed out in the written description and claims thereof, as well as the appended drawings.

To achieve these and other advantages, and in accordance with the purpose of the invention as embodied and broadly described, there is provided a method of forming self-aligned contacts that includes providing at least one stacked-gate structure on a semiconductor substrate, forming a first dielectric layer on the stacked-gate structure and the semiconductor substrate, forming a second dielectric layer on the first dielectric layer, the second dielectric layer being etch selective relative to the first dielectric layer, etching the second dielectric layer to expose a portion of the first dielectric layer formed on a top surface and along at least a portion of upper sidewalls of the stacked-gate structure, removing the exposed portion of the first dielectric layer, and forming a third dielectric layer on the sidewalls of the stacked-gate structure.

In one aspect, wherein the step of forming a first dielectric layer comprises oxidizing the stacked-gate structure and the semiconductor substrate.

In another aspect, further comprising forming a conformal first dielectric layer.

Also in accordance with the present invention, there is provided a method of forming self-aligned contacts that includes providing at least one stacked-gate structure on a semiconductor substrate, oxidizing the stacked-gate structure and the semiconductor substrate to form a first oxide layer, forming a sacrificial layer on the first oxide layer, the sacrificial layer being etch selective relative to the first oxide layer, etching the sacrificial layer to expose the first oxide layer formed on a portion of a top surface and upper sidewalls of the stacked-gate structure, removing the first oxide layer unmasked by the sacrificial layer to expose the portion of the top surface and the upper sidewalls of the stacked-gate structure, forming a spacer along the sidewalls of the stacked-gate structure, forming a second oxide layer on the spacer and the semiconductor substrate, the second oxide layer being etch selective relative to the spacer, and etching the second oxide layer and the first oxide layer to expose a contact region adjacent to the stacked-gate structure.

In one aspect, wherein oxidizing the stacked-gate structure comprises rapid thermal process with oxygen and hydrogen.

In another aspect, wherein oxidizing the stacked-gate structure comprises in-situ stream generation process with oxygen and hydrogen.

It is to be understood that both the foregoing general description and the following detailed description are exemplary and explanatory only and are not restrictive of the invention as claimed.

BRIEF DESCRIPTION OF THE DRAWINGS

The accompanying drawings, which are incorporated in and constitute a part of this specification, illustrate embodiments consistent with the invention and, together with the description, serve to explain the objects, advantages, and principles of the invention.

In the drawings.

DESCRIPTION OF THE EMBODIMENTS

Reference will now be made in detail to embodiments consistent with the invention, examples of which are illustrated in the accompanying drawings. Wherever possible, the same reference numbers will be used throughout the drawings to refer to the same or like parts.

Figure 1:
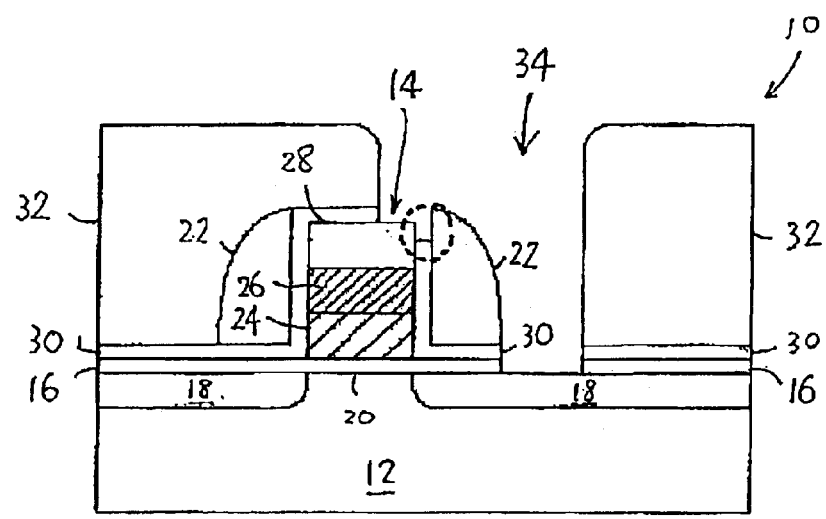
FIG. 1 shows a cross-sectional view of a conventional field-effect transistor device.
Figure 2:
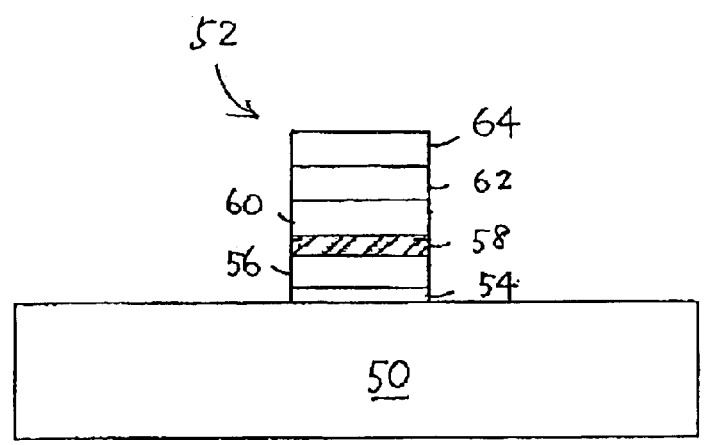
FIGS. 2 to 8 show a method of forming a self-aligned contact in accordance with one embodiment of the present invention.

FIGS. 2 to 8 show a method of forming a self-aligned contact in accordance with one embodiment of the present invention. Referring to FIG. 2, the method begins with providing a semiconductor substrate 50. Subsequently, a stacked-gate structure 52 is formed on semiconductor substrate 50. A source/drain pair and a channel may optionally be formed at this stage. Stacked-gate structure 52 includes a gate insulating layer 54, a first metal layer 56 formed on gate insulating layer 54, a second metal layer 60, and an interlayer dielectric 58 formed between first metal layer 56 and second metal layer 60 to provide electrical isolation. In one embodiment, gate insulating layer 54 is composed of silicon oxide, first metal layer 56 includes a polycrystalline silicon layer, and second metal layer 60 includes a refractory metal layer. In another embodiment, a third metal layer 62 comprised of tungsten silicon is formed on second metal layer 60 comprised of polycrystalline silicon. Third metal layer 62 may be used to enhance conductivity of stacked-gate structure 52.

A passivation layer 64, for example, a silicon nitride layer, may be formed on top of third metal layer 62 to provide electrical insulation, protection of third metal layer 62 and planarization.

Figure 3:
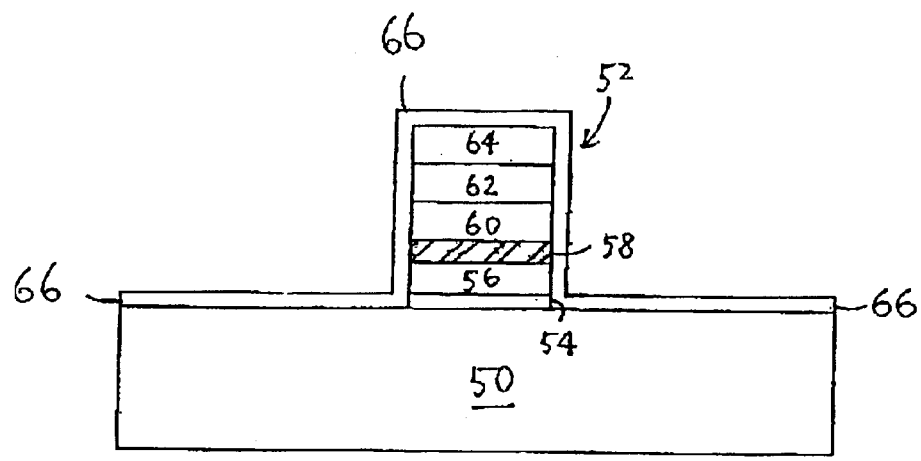

Referring to FIG. 3, subsequent to the formation of stacked-gate structure 52, a continuous first dielectric layer 66 of a first dielectric is formed on stacked-gate structure 52 and semiconductor substrate 50. First dielectric layer 66 may also be conformal. In one embodiment, first dielectric layer 66 is comprised of silicon oxide, and may be formed by oxidizing stacked-gate structure 52 and semiconductor substrate 50 through rapid thermal process ("RTP") or in-situ stream generation ("ISSG") process using oxygen and hydrogen. First dielectric layer 66 may also be provided through deposition. First dielectric layer 66 functions to serve as a buffer layer against stress generated during subsequent formation of sidewall spacers.

Figure 4:
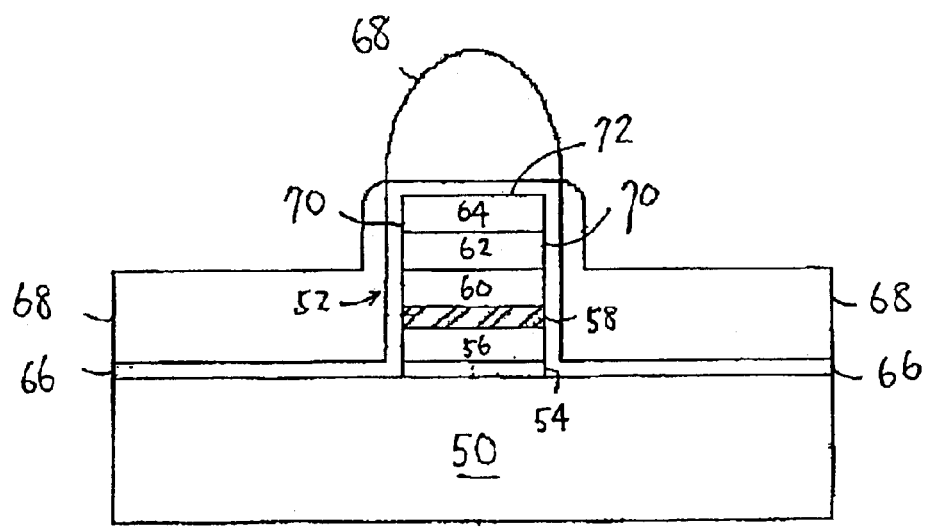

Referring to FIG. 4, a second dielectric layer 68 is formed on first dielectric layer 66. Second dielectric layer 68 exhibits a high etch selectivity relative to first dielectric layer 66 to facilitate a subsequent etching treatment. In one embodiment, second dielectric layer 68 includes silicon nitride, and first dielectric layer 66 includes silicon oxide. Second dielectric layer 68 is formed on first dielectric layer 66 by a high-density chemical vapor deposition ("HDCVD"). Due to the characteristics of HDCVD, second dielectric layer 68 formed along upper sidewalls 70 of stacked-gate structure 52 is substantially thinner than that formed over semiconductor substrate 50 and on a top surface 72 of stacked-gate structure 52. In one embodiment, second dielectric layer 68 functions to serve as a sacrificial layer.

Figure 5:
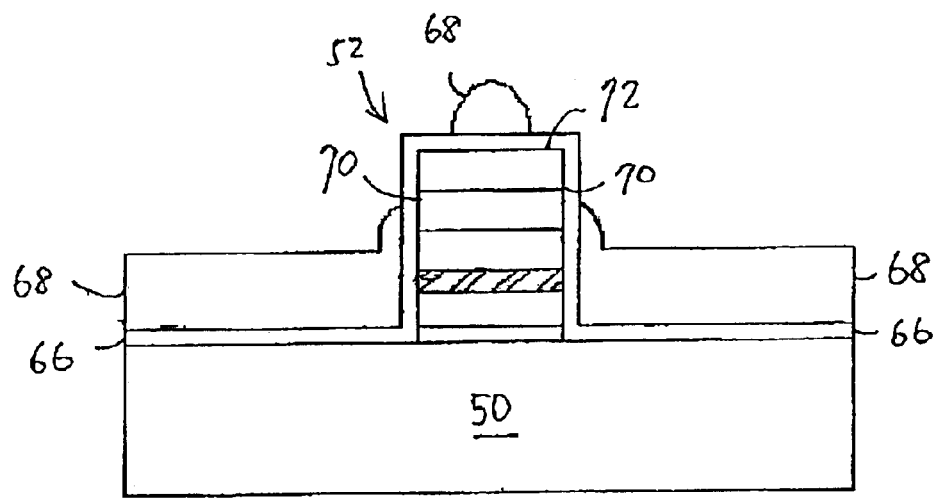

Referring to FIG. 5, second dielectric layer 68 is etched to expose first dielectric layer 66 formed on a portion of top surface 72 and along upper sidewalls 70 of stacked-gate structure 52. In one embodiment, $H_3PO_4$ is used to etch second dielectric layer 68.

Figure 6:
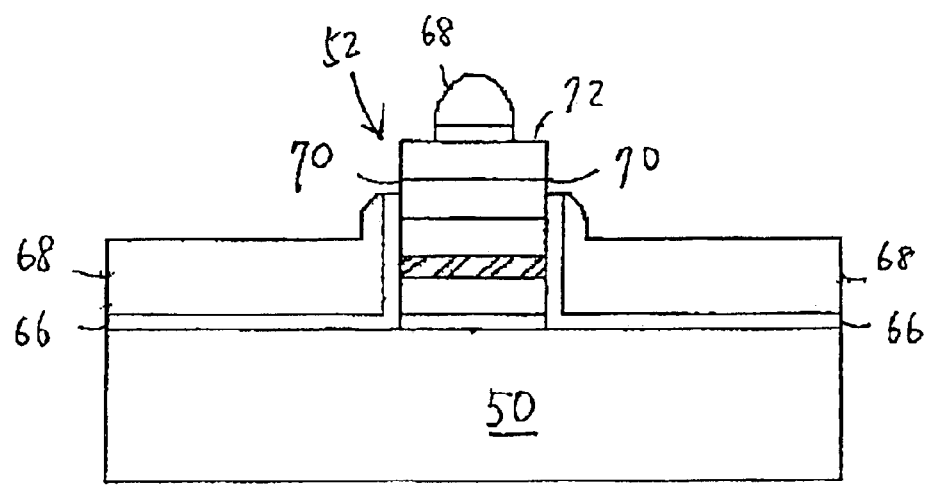

Referring to FIG. 6, after etching second dielectric layer 68, exposed first dielectric layer 66 formed on a portion of top surface 72 and along upper sidewalls 70 of stacked-gate structure 52 is removed by, for example, a dip etch to expose portions of top surface 72 and upper sidewalls 70 of stacked-gate structure 52. Due to the fact that first dielectric layer 66 exhibits a high etch selectivity relative to second dielectric layer 68, the etching process only removes a small portion, if any, of first dielectric layer 66 masked by the remaining second dielectric layer 68.

Figure 7:
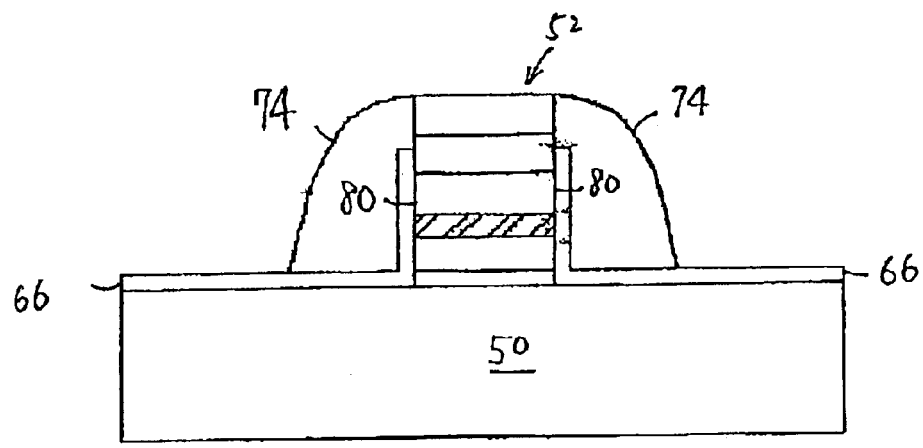

Referring to FIG. 7, subsequent to the removal of first dielectric layer 66 unmasked by the remaining second dielectric layer 68, a third dielectric layer 74 is formed along sidewalls 80 of stacked-gate structure 52 to cover the remaining first dielectric layer 66 formed on sidewalls 80. In one embodiment, before forming third dielectric layer 74, the remaining second dielectric layer 68 is completely removed. In another embodiment, second dielectric layer 68 and third dielectric layer 74 are comprised of silicon nitride so that second dielectric layer 68 may be retained during the formation of third dielectric layer 74. Third dielectric layer 74 functions to serve as a spacer to surround stacked-gate structure 52.

Figure 8:
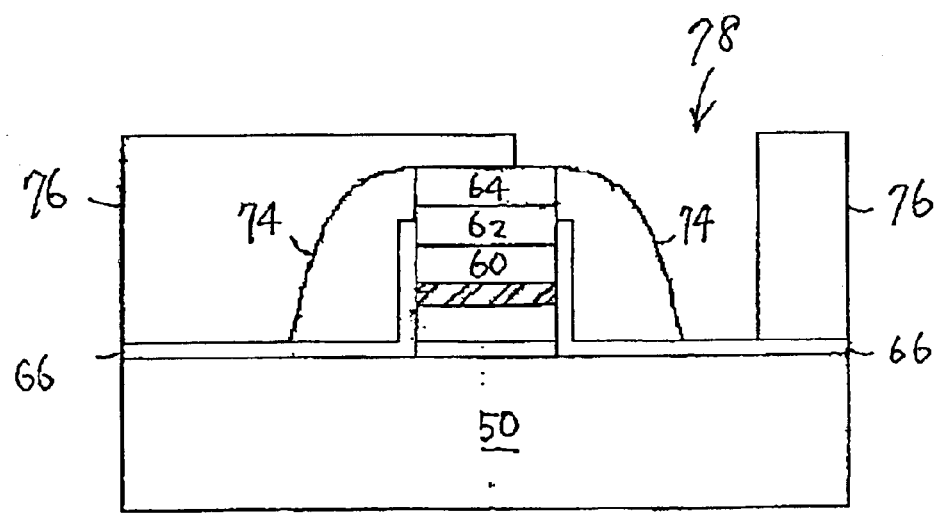

Referring to FIG. 8, subsequent to the formation of third dielectric layer 74, a fourth dielectric layer 76 is formed over third dielectric layer 74 and semiconductor substrate 50. Fourth dielectric layer 76 exhibits a high etch selectivity relative to third dielectric layer 74 to facilitate a subsequent etch treatment. In one embodiment, fourth dielectric layer 76 includes silicon oxide and third dielectric layer 74 includes silicon nitride. Next, with a patterned defined photoresist layer (not shown) provided over fourth dielectric layer 76, fourth dielectric layer 76 and remaining first dielectric layer 66 not covered by the photoresist are etched to form at least one contact opening 78 that exposes a contact region (not numbered) in semiconductor substrate 50. The contact region may include a source or drain region of an FET device. The photoresist is then removed.

The present invention therefore also provides an integrated circuit that includes a stacked-gate structure formed on a semiconductor substrate, an oxide layer formed along lower sidewalls of the stacked-gate structure, a spacer formed along and surrounding the sidewalls of the stacked-gate structure to cover the oxide layer, and a contact region formed in the semiconductor substrate and disposed adjacent to the stacked-gate structure. The stacked-gate structure may include a first metal layer, a second metal layer, and a dielectric layer formed between the first metal layer and the second metal layer. In one embodiment, the first metal layer includes polycrystalline silicon, and the second metal layer includes refractory metal such as tungsten silicon. In one embodiment, the spacer includes silicon nitride and is etch selective relative to the oxide layer. Since the oxide layer is covered by the spacer, a loss of the oxide layer material, due to attack of etchants during formation of a self-aligned contact, and hence a short circuit caused between a gate metal and a contact metal, may be avoided.

It will be apparent to those skilled in the art that various modifications and variations can be made in the disclosed process without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming self-aligned contacts, comprising:
providing at least one stacked-gate structure on a semiconductor substrate;
forming a first dielectric layer on the stacked-gate structure and the semiconductor substrate;
forming a second dielectric layer on the first dielectric layer, the second dielectric layer being etch selective relative to the first dielectric layer;
etching the second dielectric layer to expose a portion of the first dielectric layer formed on a top surface and along at least a portion of upper sidewalls of the stacked-gate structure;
removing the exposed portion of the first dielectric layer; and
forming a third dielectric layer on the sidewalls of the stacked-gate structure,
wherein a first portion of the second dielectric layer is substantially thinner along the upper sidewalls of the stacked-gate structure than a second portion of the second dielectric layer formed over the semiconductor substrate.

2. The method of claim 1, further comprising forming a conformal first dielectric layer.

3. The method of claim 1, wherein the step of providing at least one stacked-gate structure includes providing a gate insulating layer, providing a first metal layer over the gate insulating layer, providing a fourth dielectric layer over the first metal layer, and providing a second metal layer over the fourth dielectric layer.

4. The method of claim 1, further comprising forming a silicon oxide layer as the first dielectric layer.

5. The method of claim 1, further comprising forming a silicon nitride layer as the second dielectric layer.

6. The method of claim 1, further comprising forming a silicon nitride layer as the third dielectric layer.

7. The method of claim 1, wherein the step of forming a first dielectric layer comprises oxidizing the stacked-gate structure and the semiconductor substrate.

8. The method of claim 7, wherein oxidizing the stacked-gate structure comprises rapid thermal process with oxygen and hydrogen.

9. The method of claim 6, wherein oxidizing the stacked-gate structure comprises in-situ stream generation process with oxygen and hydrogen.

10. The method of claim 1, further comprising forming a fourth dielectric layer on the third dielectric layer and the semiconductor substrate, the fourth dielectric layer being etch selective relative to the third dielectric layer.

11. The method of claim 10, further comprising etching the fourth dielectric layer and the first dielectric layer to expose a contact region disposed adjacent to the stacked-gate structure in the semiconductor substrate.

12. The method of claim 10, further comprising forming a silicon oxide layer as the fourth dielectric layer.

13. The method of claim 1, further comprising forming the second dielectric layer by a high-density chemical vapor deposition.

14. The method of claim 1, further comprising removing the first dielectric layer using a dip etch.

15. The method of claim 1, further comprising removing the second dielectric layer before forming a third dielectric layer along the sidewalls of the stacked-gate structure.

16. A method of forming self-aligned contacts, comprising:
providing at least one stacked-gate structure on a semiconductor substrate;
oxidizing the stacked-gate structure and the semiconductor substrate to form a first oxide layer;
forming a sacrificial layer on the first oxide layer, the sacrificial layer being etch selective relative to the first oxide layer;
etching the sacrificial layer to expose the first oxide layer formed on a portion of a top surface and upper sidewalls of the stacked-gate structure;
removing the first oxide layer unmasked by the sacrificial layer to expose the portion of the top surface and the upper sidewalls of the stacked-gate structure;
forming a spacer along the sidewalls of the stacked-gate structure;
forming a second oxide layer on the spacer and the semiconductor substrate, the second oxide layer being etch selective relative to the spacer; and
etching the second oxide layer and the first oxide layer to expose a contact region adjacent to the stacked-gate structure.

17. The method of claim 16, wherein the step of providing at least one stacked-gate structure includes providing a gate insulating layer, providing a first metal layer over the gate insulating layer, providing a dielectric layer over the first metal layer, and providing a second metal layer over the dielectric layer.

18. The method of claim 16, further comprising forming a silicon nitride layer as the sacrificial layer.

19. The method of claim 16, wherein oxidizing the stacked-gate structure comprises rapid thermal process with oxygen and hydrogen.

20. The method of claim 16, wherein oxidizing the stacked-gate structure comprises in-situ stream generation process with oxygen and hydrogen.

* * * * *